United States Patent
Yang et al.

(10) Patent No.: US 8,309,421 B2
(45) Date of Patent: Nov. 13, 2012

(54) DUAL-BULB LAMPHEAD CONTROL METHODOLOGY

(75) Inventors: Yao-Hung Yang, Santa Clara, CA (US); Abhijit Kangude, Santa Clara, CA (US); Sanjeev Baluja, Campbell, CA (US); Michael Martinelli, Santa Clara, CA (US); Liliya Krivulina, Sunnyvale, CA (US); Thomas Nowak, Cupertino, CA (US); Juan Carlos Rocha-Alvarez, San Carlos, CA (US); Scott Hendrickson, Brentwood, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/011,687

(22) Filed: Jan. 21, 2011

(65) Prior Publication Data
US 2012/0129275 A1 May 24, 2012

Related U.S. Application Data

(60) Provisional application No. 61/416,955, filed on Nov. 24, 2010.

(51) Int. Cl.
*H01L 21/336* (2006.01)
*H01L 21/76* (2006.01)

(52) U.S. Cl. . 438/308; 438/378; 438/795; 257/E21.475; 257/E21.471; 257/E21.347; 392/407; 392/416; 250/492.1; 250/492.2; 362/243; 362/341

(58) Field of Classification Search .................. 438/308, 438/378, 676, 773, 795; 257/E21.475, E21.471, 257/E21.347; 250/492.1, 492.2, 493.1, 504 R; 362/243, 341; 392/407, 416–418
See application file for complete search history.

(56) References Cited

U.S. PATENT DOCUMENTS

| 7,709,814 | B2 | 5/2010 | Waldfried et al. |
| 2007/0228289 | A1* | 10/2007 | Kaszuba et al. ........... 250/492.1 |
| 2007/0286963 | A1 | 12/2007 | Rocha-Alvarez et al. |
| 2008/0067425 | A1 | 3/2008 | Kaszuba et al. |
| 2009/0023229 | A1 | 1/2009 | Matsushita et al. |

(Continued)

FOREIGN PATENT DOCUMENTS
JP 2005079336 A 3/2005

OTHER PUBLICATIONS

PCT International Search Report and Written Opinion dated Jun. 26, 2012 for International Application No. PCT/ US2011/058137.

*Primary Examiner* — Hsien Ming Lee
(74) *Attorney, Agent, or Firm* — Patterson & Sheridan, LLP

(57) ABSTRACT

The present invention generally relates to methods of controlling UV lamp output to increase irradiance uniformity. The methods generally include determining a baseline irradiance within a chamber, determining the relative irradiance on a substrate corresponding to a first lamp and a second lamp, and determining correction or compensation factors based on the relative irradiances and the baseline irradiance. The lamps are then adjusted via closed loop control using the correction or compensation factors to individually adjust the lamps to the desired output. The lamps may optionally be adjusted to equal irradiances prior to adjusting the lamps to the desired output. The closed loop control ensures process uniformity from substrate to substrate. The irradiance measurement and the correction or compensation factors allow for adjustment of lamp set points due to chamber component degradation, chamber component replacement, or chamber cleaning.

17 Claims, 4 Drawing Sheets

U.S. PATENT DOCUMENTS

| | | |
|---|---|---|
| 2009/0160345 A1 | 6/2009 | Bretmersky et al. |
| 2009/0305515 A1 | 12/2009 | Ho et al. |
| 2010/0096564 A1 | 4/2010 | Yang et al. |
| 2010/0096569 A1 | 4/2010 | Nguyen et al. |
| 2010/0193674 A1 | 8/2010 | Fulwood et al. |
| 2010/0285240 A1 | 11/2010 | Rocha-Alvarez et al. |

* cited by examiner

DUAL-BULB LAMPHEAD CONTROL METHODOLOGY

CROSS-REFERENCE TO RELATED APPLICATIONS

This application claims benefit of U.S. provisional patent application Ser. No. 61/416,955, filed Nov. 24, 2010, which is herein incorporated by reference.

BACKGROUND OF THE INVENTION

1. Field of the Invention

Embodiments of the present invention generally relate to methods of ultraviolet curing a substrate.

2. Description of the Related Art

Materials such as silicon oxide, silicon carbide and carbon-doped silicon oxide films find widespread use in the fabrication of semiconductor devices. One approach for forming such silicon-containing films on a substrate is through the process of chemical vapor deposition (CVD). Subsequent to formation of the CVD films, ultraviolet (UV) radiation can be used to cure and to densify the deposited films.

One manner of supplying UV radiation to a substrate uses UV radiation lamps. The bulbs used in UV lamp systems are consumable items with their life determined by a number of factors, including total hours of operation, number of starts, time in standby mode, power level, and other conditions. As UV bulbs near the end of their usable life, their output changes, thus affecting substrate-to-substrate processing uniformity. Additionally, UV bulbs within a chamber may not all be replaced simultaneously, thus, UV bulbs within the same lamp head may have different output levels. The non-uniform output within the chamber affects process uniformity across the processed substrates.

Thus, there is a need to improve the control of UV bulb output to increase process uniformity.

SUMMARY OF THE INVENTION

The present invention generally relates to methods of controlling UV lamp output to increase irradiance uniformity. The methods generally include determining a baseline irradiance within a chamber, determining the relative irradiance on a substrate corresponding to a first lamp and a second lamp, and determining correction or compensation factors based on the relative irradiances and the baseline irradiance. The lamps are then adjusted via closed loop control using the correction or compensation factors to individually adjust the lamps to the desired output. The lamps may optionally be adjusted to equal irradiances prior to adjusting the lamps to the desired output. The closed loop control ensures process uniformity from substrate to substrate. The irradiance measurement and the correction or compensation factors allow for adjustment of lamp set points due to chamber component degradation, chamber component replacement, or chamber cleaning.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to methods of controlling UV lamp output to increase irradiance uniformity. The methods generally include determining a baseline irradiance within a chamber, determining the relative irradiance on a substrate corresponding to a first lamp and a second lamp, and determining correction or compensation factors based on the relative irradiances and the baseline irradiance. The lamps are then adjusted via closed loop control using the correction or compensation factors to individually adjust the lamps to the desired output. The lamps may optionally be adjusted to equal irradiances prior to adjusting the lamps to the desired output. The closed loop control ensures process uniformity from substrate to substrate. The irradiance measurement and the correction or compensation factors allow for adjustment of lamp set points due to chamber component degradation, chamber component replacement, or chamber cleaning.

Embodiments of the present invention may be practiced in the NANOCURE™ chamber available from Applied Materials, Inc., of Santa Clara, Calif. It is contemplated that other chambers, including those from other manufacturers, may also benefit from embodiments described herein.

Figure 1:
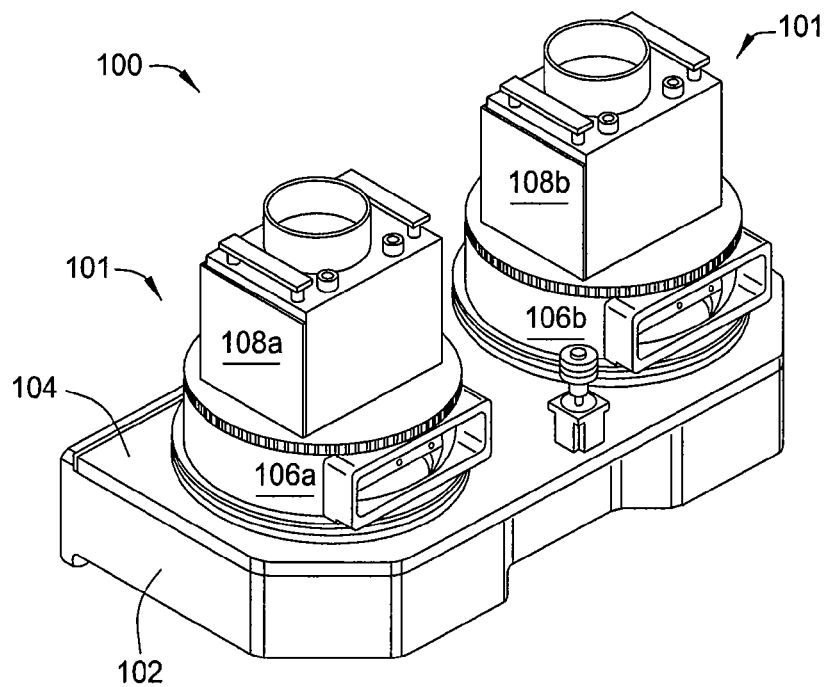
FIG. 1 is a partial schematic illustration of a tandem process chamber configured for UV curing.

FIG. 1 is a partial schematic illustration of a tandem process chamber 100 configured for UV curing. An exemplary tandem process chamber is the PRODUCER™ chamber available from Applied Materials, Inc., of Santa Clara, Calif. The tandem process chamber 100 includes two UV cure chambers 101 each adapted to process one or more substrates therein. Each of the UV cure chambers are generally separated by a wall (not shown). The tandem process chamber 100 includes a body 102 and lid 104 that is hinged to the body 102. Coupled to the upper surface of the lid is a first lower housing 106a and a second lower housing 106b. Each of the lower housings 106a, 106b are adapted to hold a secondary reflector therein. Positioned above each of the lower housings 106a, 106b are upper housings 108a, 108b, respectively. Each upper housing 108a, 108b is rotatable and has a lamp head positioned therein to provide UV radiation through the lower housings 106a, 106b and into the body 102 in which one or more substrate may be positioned to receive the UV radiation.

Figure 2A:
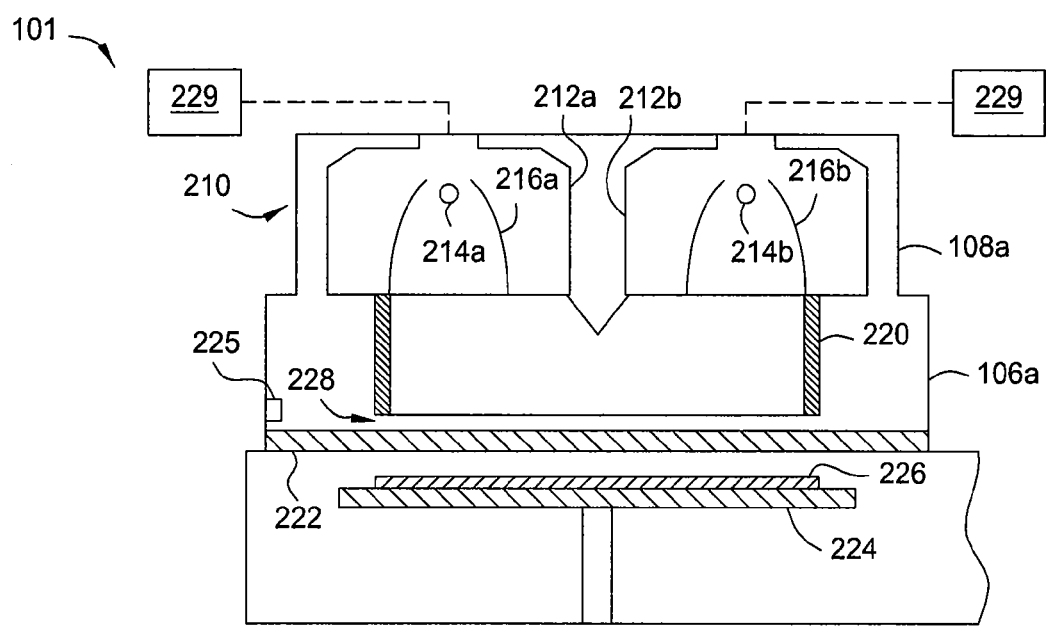
FIG. 2A is a schematic illustration of one of the UV cure chambers of the tandem process chamber of FIG. 1.

FIG. 2A is a schematic illustration of one of the UV cure chambers 101 of the tandem process chamber 100 of FIG. 1. The UV cure chamber 101 includes a UV lamp head 210, a secondary reflector 220, a quartz window 222, a substrate support 224, and controllers 229. The UV lamp head 210 is disposed within the upper housing 108a and includes two UV lamps 212a and 212b. Each UV lamp 212a, 212b includes a UV bulb 214a, 214b. A primary reflector 216a is positioned above and around the UV bulb 214a and is adapted to direct UV radiation from the UV bulb 214a through the quartz window 222 towards the substrate support 224. Similarly, a primary reflector 216b is positioned above and around the UV bulb 214b and is adapted to direct UV radiation from the UV bulb 214b through the quartz window 222 towards the substrate support 224. The output or intensity of the UV bulbs 214a and 214b is controlled by respective controllers 229. Although each UV lamp 212a, 212b of each UV cure chamber 101 is shown as having its own controller 229, it is contemplated that a single controller may used to control all aspects of the tandem process chamber 100.

A secondary reflector 220 is located within the lower housing 106a and is positioned between the UV lamp head 210 and a semiconductor substrate 226. The secondary reflector 220 is coupled to the lower surface of the UV lamps 212a and 212b, and is rotatable with the lamps 212a and 212b which are coupled to the rotatable upper housings 108a, 108b. The lower edge of the secondary reflector 220 has an inner diameter that is smaller than a diameter of the substrate 226 so there is no optical gap between the secondary reflector 220 and the outside diameter of the substrate 226 as viewed from the direction of the lamp head 210. The secondary reflector 220 has a channeling effect reflecting UV radiation that would otherwise fall outside the boundary of the primary reflectors' flood pattern so that such radiation impinges upon the substrate 226 being UV cured. Thus, the intensity of the energy distributed to the substrate 226 is increased. The secondary reflector 220 alters the flood pattern of the UV lamps 212a, 212b from a substantially rectangular area to a substantially circular shape that corresponds to the substantially circular shape of the substrate 226. A sensor 225 is coupled to the interior surface of the lower housing 106a and is positioned to sense UV radiation through holes disposed in the secondary reflector 220 as the secondary reflector 220 rotates.

The quartz window 222 is positioned between the lamp head 210 and the substrate 226. A small gap 228 exists between the bottom of the secondary reflector 220 and the quartz window 222 to allow for air flow around the secondary reflector 220 to facilitate cooling. Air flow may be provided to the secondary reflector and/or the quartz window through one or more openings disposed in the lower housing 106a.

The UV bulbs 214a and 214b are microwave arc lamps; however, other types of UV sources are contemplated, including pulsed xenon flash lamps or high-efficiency UV light emitting diode arrays. The UV bulbs 214a and 214b are sealed plasma bulbs filled with one or more gases such as xenon or mercury for excitation by power sources, such as microwave generators. The microwave generators include one or more magnetrons to excite the gases within the UV bulbs 214a and 214b. Alternatively, radio frequency (RF) energy sources may be used to excite the gases within the UV bulbs 214a and 214b. The RF excitation can be capacitive or inductive; however, an inductively coupled plasma bulb can more efficiently generates greater bulb brilliancy by generation of denser plasma.

Desirably, the UV bulbs 214a and 214b emit light across a broad band of wavelengths from 180 nm to 400 nm. The gases selected for use within the UV bulbs 214a and 214b generally determine the wavelengths of radiation emitted. Since shorter wavelengths tend to generate ozone when oxygen is present within the UV cure chamber 101, UV light emitted by the UV bulbs 214a and 214b is tuned to predominantly generate broadband UV light above 200 nm to avoid ozone generation during cure processes.

Figure 2B:
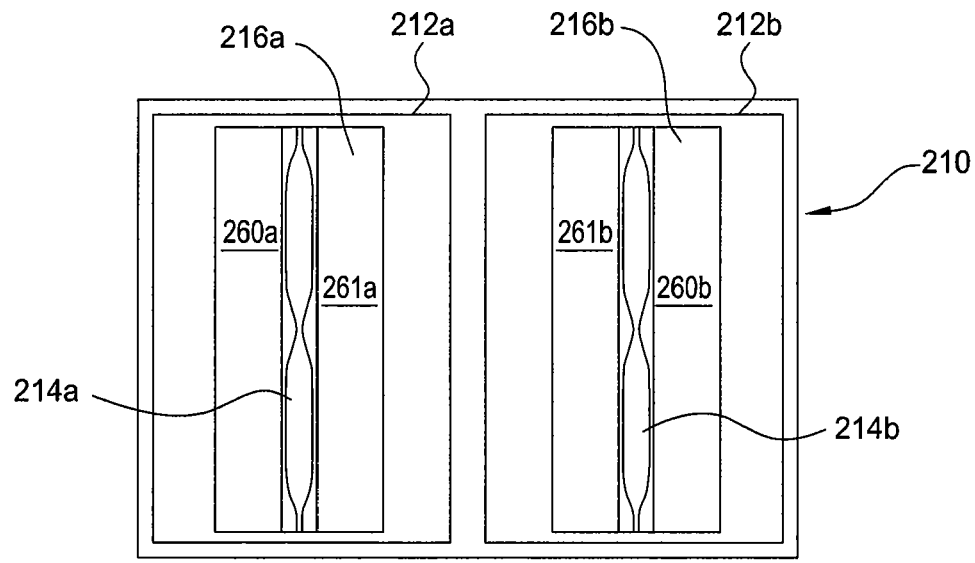
FIG. 2B is a schematic illustration of a bottom view of a UV lamp head for a UV cure chamber.

FIG. 2B is a schematic illustration of a bottom view of a UV lamp head 210 for a UV cure chamber 101. The UV lamp head 210 houses two lamps 212a, 212b, each of which contains an elongated UV bulb 214a, 214b. The bulbs generate UV radiation which is directed to the substrate 226 by the primary reflectors 216a, 216b and the secondary reflector 220. The primary reflector 216a is formed from a portion 260a and a portion 261a with a gap therebetween. Similarly, the primary reflector 216b is formed from a portion 260b and a portion 261b with a gap therebetween. Although the UV lamp head 210 is shown as containing two elongated bulbs, it is contemplated that the UV lamp head 210 may contain more than two bulbs.

Figure 2C:
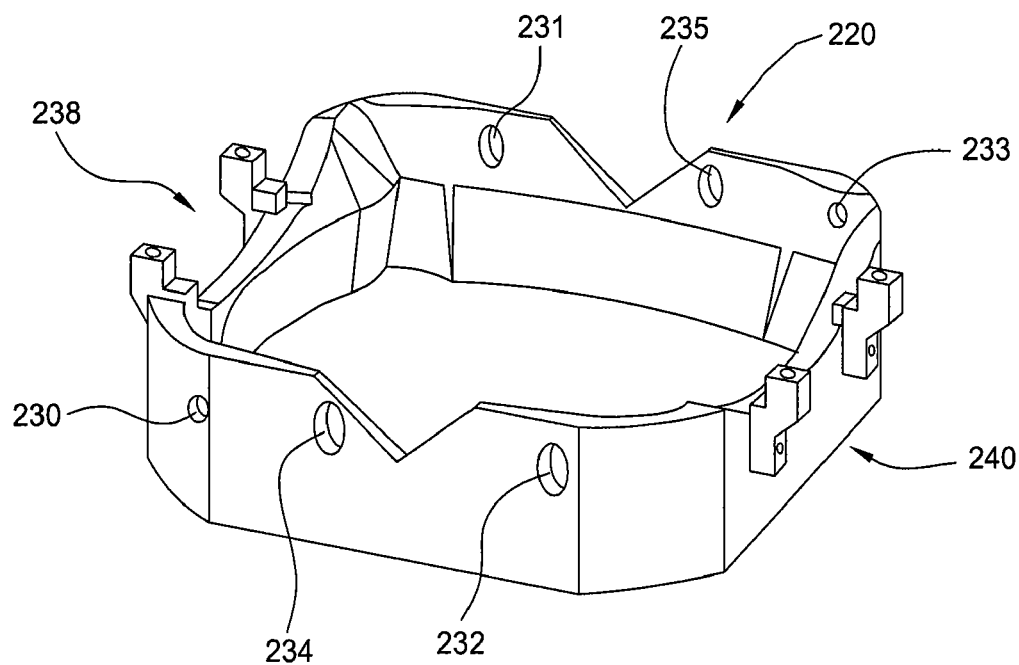
FIG. 2C is a schematic illustration of a secondary reflector for a UV cure chamber.

FIG. 2C is a schematic illustration of a secondary reflector 220 for a UV cure chamber 101. The secondary reflector 220 is oriented in the chamber such that a portion 238 is located adjacent to the lamp 212a, and a portion 240 is located adjacent to the lamp 212b. The secondary reflector not only directs UV radiation towards the substrate 226, but also allows for measurement of UV radiation intensity generated or reflected by different components within the UV cure chamber 101. The secondary reflector 220 includes light pipes 230-235 to monitor separate components within the UV cure chamber 101. Although the term "pipe" is used, the light pipes 230-235 may simply be holes disposed through the wall of the secondary reflector 220, and may or may not include an elongated tube coupled to the outer wall of the secondary reflector. A sensor 225 adapted to measure UV radiation intensity is coupled to a lower housing adjacent the secondary reflector 220. The sensor 225 is positioned to receive UV radiation exiting each of the light pipes 230-235 while the secondary reflector 220 rotates during processing. The sensor 225 is connected to the controllers 229 and is adapted to provide UV intensity information to the controllers 229.

The amount of UV radiation reaching the substrate is function of UV radiation emitted from the UV bulbs 214a, 214b as well as the light reflected from the portions 260a, 260b, 261a, and 261b of the primary reflectors 216a, 216b. This function is generally empirically determined, and it is to be understood that this function is generally different for each individual UV cure chamber 101. The function varies depending on the type of UV bulb used, the reflectivity of the primary and secondary reflectors, position of the substrate relative to the UV bulbs and reflectors, and chamber dimensions, among other factors.

Each light pipe 230-235 is coupled to the secondary reflector 220 at an angle which allows only light from the one specific chamber component to pass therethrough and contact the sensor 225 as the light pipes 230-235 rotate past the stationary sensor 225. Depending on the thickness of the wall of the secondary reflector 220 in the region of an individual light pipe, the length of the light pipe may be extended by inserting an aluminum tube into the hole or slot formed through the wall of the secondary reflector 220. To reduce the effects of reflectance within the light pipe and to ensure that only radiation rays within the particular angle of acceptance reach the sensor 225, the interior surfaces of a light pipe may be lined or coated with an appropriate light absorbing material. Alternatively, the interior surface of a light pipe may be treated to have a roughened or textured surface to dissipate, via multiple reflections, unwanted light that contacts the wall of the light pipes 230-235.

In monitoring the individual components of the UV cure chamber 101, it is desirable that the light pipes 230-235 allow only rays generated by or reflected by the desired component to reach the sensor at the end of the light pipe that monitors that component. In some instances it may not be practical to design the light pipe such that 100 percent of the rays reaching the sensor 225 are from a single component. Instead, the light pipe may be designed so that a suitably high percentage, e.g., 80 percent or 90 percent of the rays that reach the sensor 225 are from the desired component. In such a design, the controllers 229 should be able to account for the portion of the sensed light which is from an undesired component.

During processing, the lamps 212a, 212a, as well as the secondary reflector coupled thereto rotate while providing UV radiation to the substrate 226. As the light pipes 230-235 rotate past the sensor 225, UV output or reflectance of specific chamber components is determined. To increase the accuracy of the sensor measurements (e.g., increase the number of sampling points), the rotational speed of the lamps 212a, 212b and the secondary reflector 220 may be reduced when any of the light pipes 230-235 are adjacent to the sensor 225. For example, when any of the light pipes 230-235 are passing by the sensor 225, the secondary reflector may rotate at about 0.1 to about 0.2 revolutions per minute. When any of the light pipes are not adjacent the sensor 225 (e.g., the area of the secondary reflector 220 between the light pipes 230-235), the secondary reflector may rotate at greater than one revolution per minute, for example, at about one to about two revolutions per minute. Thus, the rotational speed of the lamps 212a, 212b and the secondary reflector 220 are variable.

In the embodiment of FIG. 2C, the light pipe 230 monitors the reflectance of the portion 260a of the primary reflector 216a. The light pipe 231 monitors the reflectance of the portion 261a of the primary reflector 216a. The light pipe 232 monitors the reflectance of the portion 261b of the primary reflector 216b. The light pipe 233 monitors the reflectance of the portion 260b of the primary reflector 216b. The light pipes 234 and 235 monitor the intensity of the UV bulbs 214a and 214b, respectively.

The ability of the secondary reflector 220 to monitor the UV radiation generated by or reflected by individual components allows for monitoring and compensation of those components within the UV chamber 101. Monitoring of individual components is desirable since light reflectance or generation of these components decreases with time. For example, material may accumulate on the surface of the primary reflectors 216a, 216b, which decreases the amount and/or intensity of reflected UV radiation directed towards the substrate 226. Also, material may accumulate on the surface of the quartz window 222 thereby decreasing the amount of UV radiation passing therethrough and reaching the substrate 226. Further, the intensity of the UV bulbs 214a, 214b decreases as the UV bulbs 214a, 214b approach their useful life. However, since the secondary reflector 220 allows the intensity of the individual components within the UV chamber to be monitored, a correction factor can be adjusted to account for the decreasing efficiency of the components. Thus, substrate 226 can receive a uniform amount of UV radiation, thereby increasing process uniformity, even though light reflectance or generation of some components has decreased.

Figure 3:
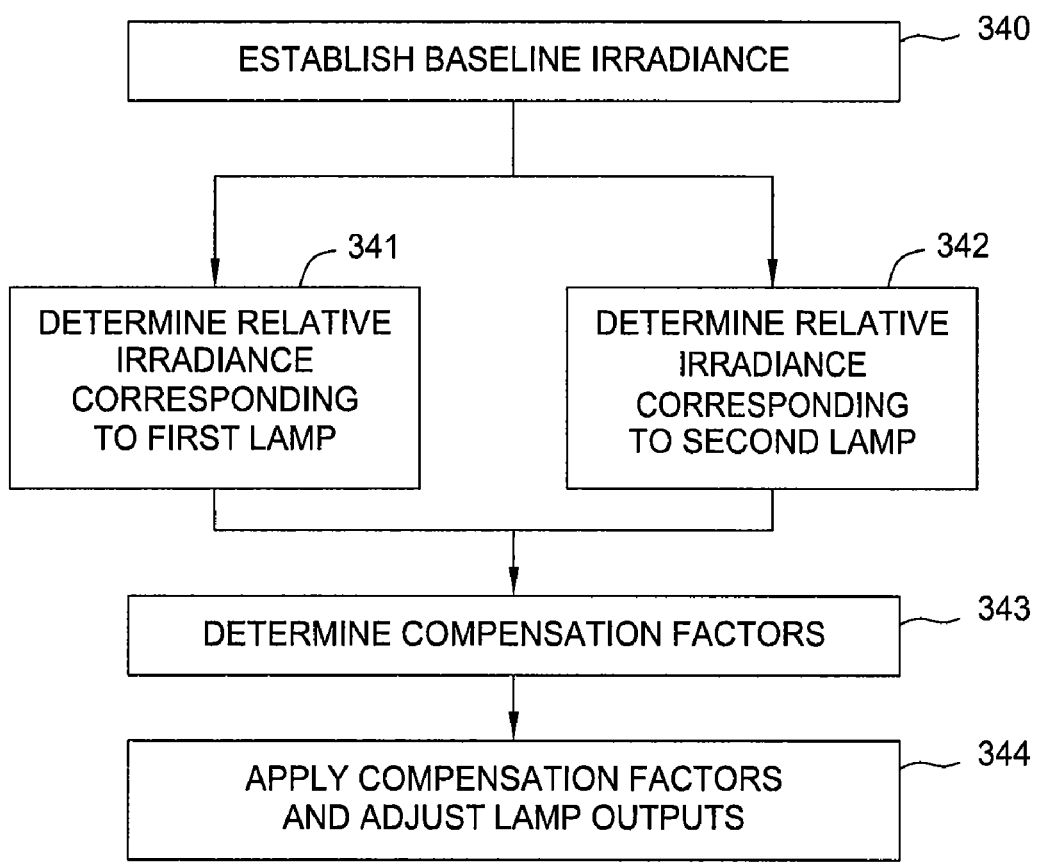
FIG. 3 is a flow chart illustrating one embodiment for adjusting UV intensity within a UV cure chamber.

In a typical UV curing process, a single UV radiation sensor located within the UV curing chamber measures the overall level of UV radiation within the chamber. For example, the sensor may indicate that the level of UV radiation within the chamber is too low, in which case, the power applied to the UV lamps is increased in order to increase the level of UV radiation within the chamber. A first problem with the typical UV curing process is that the sensor measures overall UV intensity, and not the intensity of individual components. Thus, if one UV bulb is nearly burned out, or if one reflector is covered in particle accumulation and has lost its ability to efficiently reflect UV radiation, the sensor is unable to identify the decreasing efficiency of the component. Secondly, since the typical UV curing process is unable to detect the UV radiation reflected or generated by individual components, the typical UV process is unable to adjust process parameters to account for the decreasing efficiency of a single component. Rather, the typical UV process just applies more power to the system as a whole to adjust the UV intensity within the chamber, and does not take into account the amount of power being applied to individual UV bulbs. This results in non-uniform irradiation of the substrate and decreased process uniformity FIG. 3 is a flow chart illustrating one embodiment for adjusting UV intensity within a UV cure chamber 101. In step 340, a baseline irradiance is established. The baseline irradiance is the irradiance on the substrate corresponding to optimal performance of all chamber components. Generally, the baseline irradiance corresponds to 100 percent lamp performance. However, during processing, the UV lamps 212a and 212b are set to a set point less than 100 percent to allow for adjustment in response to component degradation. For example, during processing, the UV lamps 212a, 212b may be set at about 80 percent of maximum power.

As substrates are processed within the UV cure chamber 101, the efficiency of individual chamber components decreases. Thus, the amount of UV radiation reaching the substrate 226 also decreases. The secondary reflector 220 and the sensor 225 positioned thereby allow for measurement of the decreasing efficiency of the system, and correspondingly, the amount of UV radiation reaching the substrate 226. In step 341, the amount of UV radiation being delivered to the substrate 226 by a first lamp is measured via the secondary reflector 220 and the sensor 225 positioned near the secondary reflector 220. The amount of UV radiation reaching the substrate 226 is determined by measuring the decreasing efficiency of individual chamber components. The measured irradiance reaching the substrate 226 for a given lamp is referred to as the relative irradiance. Prior to processing, the relative irradiance is equal to the process set point, since no degradation of chamber components has yet occurred. In step 342, the amount of UV radiation being delivered to the substrate 226 by a second lamp is measured via the secondary reflector 220 and the sensor 225. Additionally, the relative irradiance for the second lamp is also determined. Generally, steps 341 and 342 occur simultaneously; however, it is contemplated that steps 341 and 342 may occur successively.

In step 343, a lamp compensation factor is determined for each of lamps 212a and 212b. The lamp compensation factor is the relative irradiance divided by the baseline irradiance. In step 344, the controllers 229 containing a closed-loop algorithm adjust the power applied to each of lamps 212a and 212b. The target point for the controller is equal to the original set point (e.g., 80 percent) divided by the lamp compensation factor. Thus, as more substrates are processed and the efficiency of the chamber components decreases, the controllers 229 increase the set point (since the lamp control factor is generally less than 1). Although the set point is increased, the chamber efficiency has decreased; therefore the total amount of UV radiation reaching the substrate 226 remains constant from process to process. Steps 341-344 may be performed real time, or every few substrates, or as desired. Generally, step 340 is performed at the beginning of a process to establish the desired amount of UV radiation reaching the substrate 226 for a specific process recipe.

As described in relation to FIG. 3, each of the lamps 212a and 212b is controlled by its own closed-loop algorithm stored on the controllers 229. Since the process chamber 100 includes two UV cure chambers 101, the tandem process chamber 100 includes four controllers 229. It is contemplated that the lamps 212a, 212a may contain more than one bulb 214a, 214b each, in which case, the controllers 229 could provide closed loop control for each bulb or for each lamp 212a, 212b individually.

The control process outlined in FIG. 3 allows for uniform irradiation of a substrate 226 regardless of the condition of the chamber components, since each of the lamps 212a, 212b can be individually controlled and compensated for specific component degradation. This is desirable since chamber components do not always degrade at that same rate. For example, if the bulb 214a burns out prior to the bulb 214b, then the bulb 214a will be replaced with a new (and brighter bulb). Thus, the irradiation provided by the new bulb and the bulb 214b would not be equivalent. However, using the control process outlined in FIG. 3, the output of the new bulb and the bulb 214b could be adjusted using compensation factors to ensure that UV irradiation across the substrate 226 is uniform. The control process of FIG. 3 would likewise apply to the replacement of other chamber components, such as the magnetrons or the primary reflectors 216a, 216b. Additionally, the control process of FIG. 3 is beneficial when chamber components may be cleaned at different rates.

Figure 4:
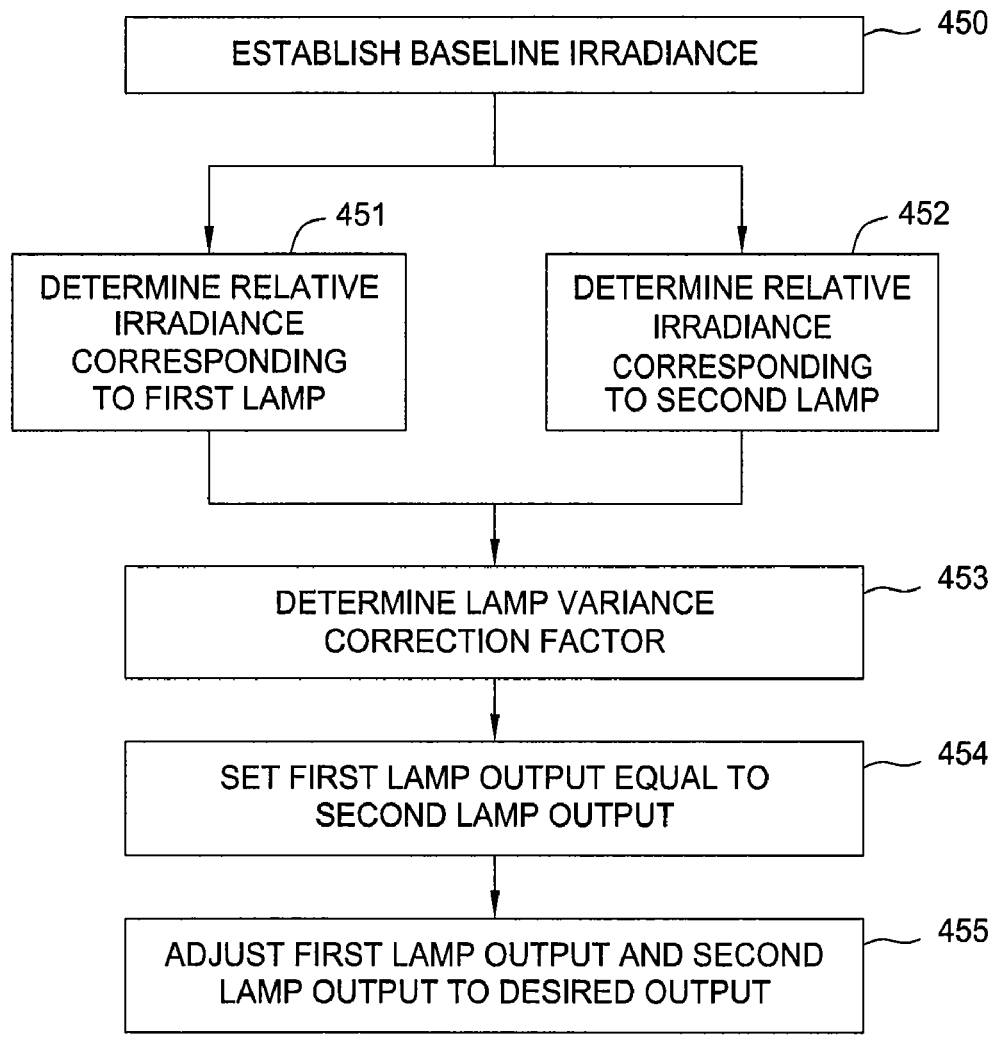
FIG. 4 is a flow chart illustrating another embodiment for adjusting UV intensity within a UV cure chamber.

FIG. 4 is a flow chart illustrating another embodiment for adjusting UV intensity within a UV cure chamber. In step 450, a baseline irradiance is established similar to step 340. In step 451, a relative irradiance corresponding to a first lamp is determined, similar to step 341. In step 452, a relative irradiance corresponding to a second lamp is determined, similar to step 342. Steps 451 and 452 generally occur simultaneously; however, it is contemplated that steps 451 and 452 may occur successively.

In step 453, a lamp variance correction factor is determined. The lamp variance correction factor is the factor by which the set point of lamp 212a or 212b, whichever has the lower relative irradiance, must be adjusted so that both lamps 212a and 212b have the same relative irradiance. In step 454, the lamp variance correction factor is applied so that both lamps 212a and 212b have the same relative irradiance. Thus, even though the relative irradiance may not be equal to the baseline irradiance, at least the irradiance across the substrate 226 is uniform.

In step 455, both of the lamps 212a and 212b are adjusted simultaneously to the desired UV output. This can be accomplished by determining a compensation factor as described in steps 343 and 344. Alternatively, since the lamps 212a and 212b have the same UV irradiance output (due to the applied lamp variance correction factor), the lamp head 210 can be adjusted in response to the signal from a single UV sensor. Furthermore, since the lamps 212a and 212b have previously been adjusted to the same relative irradiance, the change in UV irradiance across the substrate is uniform as the controller adjusts the output of the lamps 212a and 212b. This results in a more uniform curing across the processed substrate since the rate of change of each lamp is approximately equal. After adjusting the outputs of lamps 212a and 212b for a first UV cure chamber 101, the process is repeated for a second UV cure chamber 101. Desirably, the output of lamps 212a and 212b in each of the UV cure chambers 101 is equal.

Benefits of the present invention include closed loop control of UV cure processes within a UV cure chamber. Additionally, the condition and efficiency of chamber components can be monitored during processing, and decreases in efficiency can be compensated for by applying correction factors. Furthermore, the application of the correction factors allows uniform UV lamp output, as well uniform UV lamp head output, thereby increasing process uniformity.

While the foregoing is directed to embodiments of the present invention, other and further embodiments of the invention may be devised without departing from the basic scope thereof, and the scope thereof is determined by the claims that follow.

We claim:

1. A method of controlling ultraviolet lamp output, comprising:
   establishing a baseline irradiance;
   determining a relative irradiance corresponding to a first lamp using a light pipe having a sensor that is adapted to measure UV radiation intensity and is coupled to a controller;
   determining a relative irradiance corresponding to a second lamp;
   determining a compensation factor for the first lamp;
   determining a compensation factor for the second lamp; and
   adjusting an output of the first lamp and an output of the second lamp to a desired output.

2. The method of claim 1, wherein the baseline irradiance is determined at a lamp set point equal to 100 percent.

3. The method of claim 2, wherein the adjusting an output is a closed loop process.

4. The method of claim 3, further comprising adjusting a third and fourth lamp to the desired output, the third and fourth lamps located in a different chamber than the first and second lamps.

5. The method of claim 3, wherein the compensation factor for the first lamp and the compensation factor for the second lamp compensate for a decreased efficiency of UV bulbs located within the first lamp and the second lamp.

6. The method of claim 3, wherein the compensation factor for the first lamp and the compensation factor for the second lamp compensate for a decreased efficiency of reflectors located within the first lamp and the second lamp.

7. The method of claim 6, wherein the adjusting is performed during a UV curing process.

8. The method of claim 7, wherein the determining a relative irradiance corresponding to a first lamp comprises sensing ultraviolet radiation through holes disposed in a reflector located proximate to a substrate.

9. The method of claim 8, further comprising ultraviolet curing a plurality of substrates.

10. The method of claim 9, wherein the desired output of the first and second lamps is equal to the baseline irradiance.

11. A method of controlling ultraviolet lamp output, comprising:
    establishing a baseline irradiance;
    determining a relative irradiance corresponding to a first lamp using a sensor that is adapted to measure UV radiation intensity and coupled to a controller;
    determining a relative irradiance corresponding to a second lamp;
    adjusting the relative irradiance corresponding to the first lamp equal to the relative irradiance corresponding to the second lamp; and then
    adjusting the first lamp and the second lamp to the baseline irradiance.

12. The method of claim 11, wherein the baseline irradiance is determined at a lamp set point equal to 100 percent.

13. The method of claim 12, further comprising determining a lamp variance correction factor prior to the adjusting the relative irradiance corresponding to the first lamp equal to the relative irradiance corresponding to the second lamp.

14. The method of claim 13, wherein the lamp variance correction factor is the factor by which a set point of the first lamp must be adjusted so that both the first lamp and the second lamp have the same relative irradiance.

15. The method of claim 14, wherein the adjusting is performed during a UV curing process.

16. The method of claim 15, wherein the adjusting the first lamp and the second lamp is a closed loop process.

17. The method of claim 16, further comprising ultraviolet curing a plurality of substrates.

* * * * *